United States Patent
Lin (10) Patent No.: US 9,996,462 B1
(45) Date of Patent: Jun. 12, 2018

(54) DATA STORAGE DEVICE AND DATA MAINTENANCE METHOD THEREOF

(71) Applicant: Silicon Motion, Inc., Jhubei (TW)

(72) Inventor: Wen-Sheng Lin, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 0 days. days.

(21) Appl. No.: 15/662,836

(22) Filed: Jul. 28, 2017

(30) Foreign Application Priority Data

Dec. 14, 2016 (TW) .............................. 105141371 A (51) Int. Cl.
*G11C 8/00* (2006.01)
*G06F 12/02* (2006.01)
*G06F 3/06* (2006.01)
*G11C 16/10* (2006.01)

(52) U.S. Cl.
CPC ........ *G06F 12/0292* (2013.01); *G06F 3/0679* (2013.01); *G06F 12/0246* (2013.01); *G11C 16/105* (2013.01)

(58) Field of Classification Search
CPC .............. G06F 12/0292; G06F 3/0679; G06F 12/0246; G11C 16/105
See application file for complete search history.

(56) References Cited

U.S. PATENT DOCUMENTS

| | | | | |
|---|---|---|---|---|
| 8,527,717 | B2 * | 9/2013 | Aoki | G11C 7/1006 365/189.05 |
| 9,613,708 | B1 * | 4/2017 | Hsieh | G11C 16/26 |
| 9,747,173 | B2 * | 8/2017 | Ke | G06F 3/0619 |
| 2010/0042773 | A1 | 2/2010 | Yeh | |
| 2014/0006688 | A1 | 1/2014 | Yu et al. | |

FOREIGN PATENT DOCUMENTS

TW 200715114 A 4/2007
TW 201635085 A 10/2016

OTHER PUBLICATIONS

Office Action of corresponding TW application, published on May 22, 2017.

* cited by examiner

*Primary Examiner* — Pho M Luu
(74) *Attorney, Agent, or Firm* — Wang Law Firm, Inc.

(57) ABSTRACT

The present invention provides a data storage device that includes a flash memory and a controller. The flash memory has a plurality of blocks, and each of the blocks has a plurality of pages arranged sequentially along a first direction. The controller determines whether an X-th page of a temporary block of the blocks can be successfully read when the data storage device resumes operation after a power-off event, and writes dummy data and a temporary-block table into the (X+1)-th page of the temporary block when the X-th page can be successfully read, wherein the X-th page is the page that was read last from the temporary block before the power-off event occurred, the temporary-block table records the information of all the pages in the temporary block, and X is a positive integer.

22 Claims, 9 Drawing Sheets

DATA STORAGE DEVICE AND DATA MAINTENANCE METHOD THEREOF

CROSS REFERENCE TO RELATED APPLICATIONS

This Application claims priority of Taiwan Patent Application No. 105141371, filed on Dec. 14, 2016, the entirety of which is incorporated by reference herein.

BACKGROUND OF THE INVENTION

Field of the Invention

The present invention relates to a data storage device, and in particular to a data storage device capable of recovering the record of data status.

Description of the Related Art

Flash memory is considered a non-volatile data-storage device that uses electrical methods to erase and program itself. NAND Flash, for example, is often used in memory cards, USB flash devices, solid state devices, eMMCs, and other memory devices.

Flash memory such as NAND Flash uses a multiple-block structure to store data, wherein flash memory uses floating gate transistors. The floating gates of the floating gate transistor may catch electronic charges for storing data. Moreover, the flash memory needs a table to record the physical page and the logical page indicated by the host. The table will be lost in the random access memory when an unexpected power-off event occurs. Therefore, it is important to rebuild the lost table.

BRIEF SUMMARY OF THE INVENTION

A detailed description is given in the following embodiments with reference to the accompanying drawings.

An exemplary embodiment provides a data storage device that includes a flash memory and a controller. The flash memory has a plurality of blocks, and each of the blocks has a plurality of pages arranged sequentially along a first direction. The controller determines whether an X-th page of a temporary block of the blocks can be successfully read when the data storage device resumes operation after a power-off event, and writes dummy data and a temporary-block table into the (X+1)-th page of the temporary block when the X-th page can be successfully read, wherein the X-th page is the page that was read last from the temporary block before the power-off event occurred, the temporary-block table records the information of all the pages in the temporary block, and X is a positive integer.

Another exemplary embodiment provides a data maintenance method, applied to a data storage device having a flash memory, wherein the flash memory comprises a plurality of blocks, and each of the blocks has a plurality of pages arranged sequentially along a first direction. The data maintenance method includes: determining whether an X-th page of a temporary block of the blocks can be successfully read when the data storage device resumes operation after a power-off event; and writing dummy data and a temporary-block table into the (X+1)-th page of the temporary block when the X-th page can be successfully read, wherein the X-th page is the page that was read last from the temporary block before the power-off event occurred, the temporary-block table records the information of all the pages in the temporary block, and X is a positive integer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
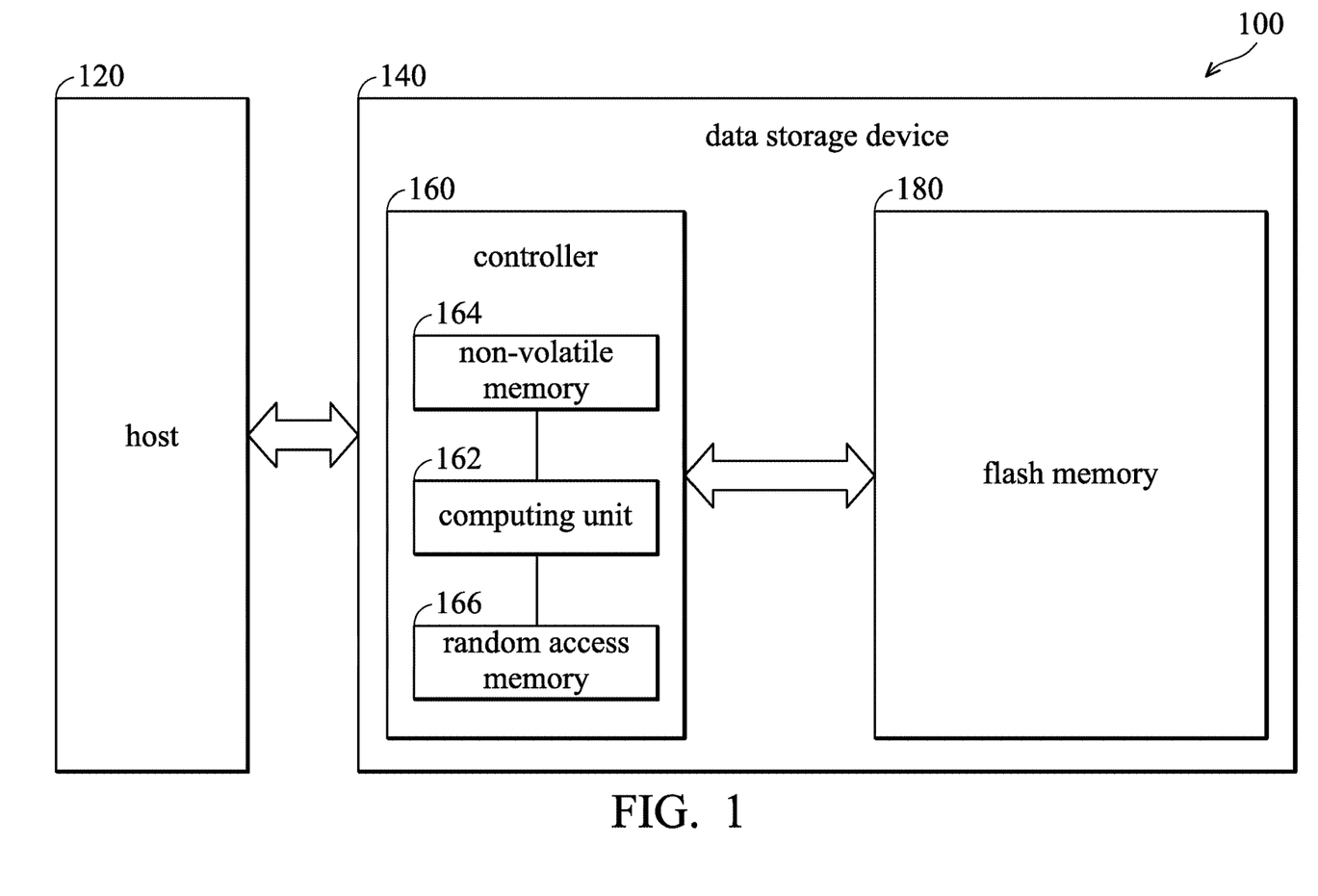
FIG. 1 is a schematic diagram illustrating an electronic system in accordance with an embodiment.
Figure 2:
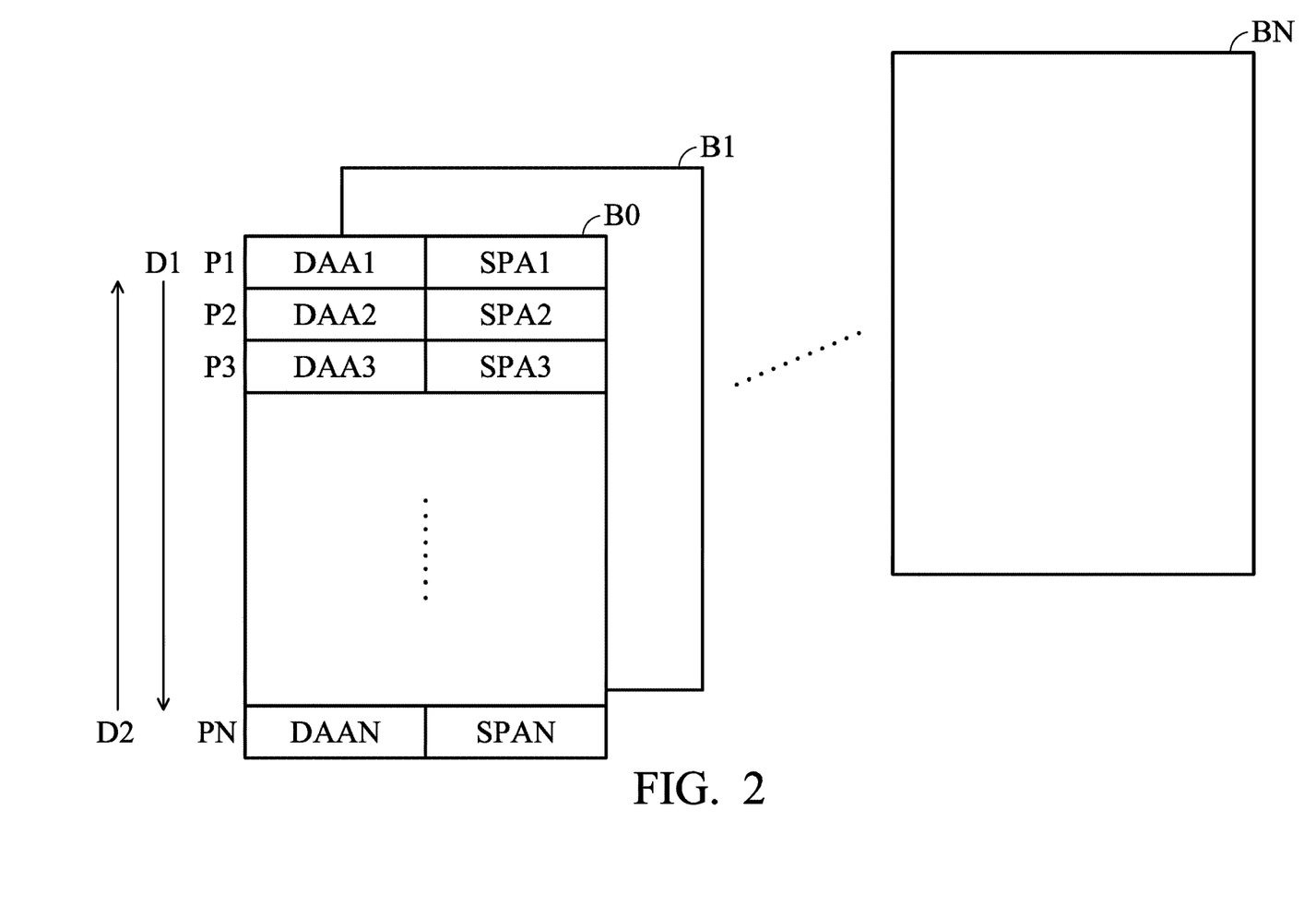
FIG. 2 is a schematic diagram illustrating a flash memory in accordance with an embodiment.

FIG. 1 is a schematic diagram illustrating an electronic system in accordance with an embodiment. The electronic system 100 includes a host 120 and a data storage device 140. The data storage device 140 includes a flash memory 180 and a controller 160, and operates in response to the commands of the host 120. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The random access memory 166 is arranged to load program codes and parameters for the controller 160. The flash memory 180 includes a plurality of blocks, each of the blocks has a plurality of pages P1~PN arranged sequentially along a first direction D1, wherein the pages P1~PN have a plurality of user-data areas DAA1~DAAN and a plurality of spare areas SPA1~SPAN, as shown in FIG. 2. It should be noted that the minimum write unit of the flash memory 180 is a page, and the minimum erase unit of the flash memory 180 is a block. Moreover, the spare areas SPA1~SPAN can be arranged at the head or the tail of the corresponding page, but it is not limited thereto. In other embodiments, the spare areas SPA1~SPAN can also be arranged at the head or the tail of the blocks B0~BN. It should be noted that, in one embodiment, each of the spare areas of the pages having valid data includes the information of the page, such as the corresponding logical address, data status, etc.

In one embodiment, the controller 160 selects an available block from the blocks B0~BN of the flash memory 180 to serve as a current block, and builds a physical-to-logical mapping table in the random access memory 166 to record the relationships of the physical addresses of the pages and the logical addresses of the pages of data. When the current block is filled by user data, the controller 160 integrates the physical-logical mapping table into a data mapping table stored in the flash memory 180, defines the current block as a mother block (data block), selects another block from the blocks B0~BN of the flash memory 180 to serve as a new current block, and build a new physical-logical mapping table in the random access memory 166 to record the mapping relationships of the physical addresses and the logical address of the pages in the new current block.

However, some types of user data will be repeatedly written into the same logical address of the flash memory 180, such that the prior data of the same logical address will be invalidated. When the data blocks (mother blocks) of the blocks B0~BN have too much invalid data, the controller 160 will frequently perform an organizing process to release the memory space of the flash memory 180. However, frequent use of the organizing process may reduce the effectiveness of the data storage device 140.

In view of this, in one embodiment, the system data sectors will be repeatedly written into the same logical address, such that the controller 160 will store the system data sectors into a specific block (temporary block). Moreover, the controller 160 will also build a temporary-block table in the random access memory 166 to record the mapping relationships of the physical addresses and the logical addresses of the pages in the temporary block. It should be noted that the temporary-block table records the information of all of the pages of the temporary block. Namely, the temporary-block table records all of the mapping relationships of the addresses of all the pages in the temporary block.

In this embodiment, the flash memory 180 has a temporary block and a current block, wherein the temporary block is arranged to store the system data sectors, and the current block is arranged to store the data other than the system data sectors. Namely, each of the pages of the temporary block has a user-data area arranged to store a system data sector that is shorter than a predetermined length. It should be noted that the system data sector is the data that is written into the flash memory 180 for operating the host 120 or the data storage device 140, and the system data sectors is a kind of user data. In one embodiment, all of the system data sectors will be shorter than the predetermined length. For example, all of the system data sectors are shorter than 12K bytes, but it is not limited thereto. In other embodiments, the predetermined length can also be 9K bytes, 10K bytes, 11K bytes, 13K bytes, 14K bytes, etc. It should be noted that, in this embodiment, each of the system data sectors is shorter than the length of one user-data area of one page. In one embodiment, the size of each of the user-data areas DDA0~DDAN of the pages is 16K bytes, but it is not limited thereto. Moreover, the controller 160 can determine whether the data to be written belongs to the system data according to the length and the logical address of the data.

When a power-off event occurs, the physical-logical mapping table and the temporary-block table, which are stored in the random access memory 166, will be lost. Therefore, after the data storage device 140 resumes operation after a power-off event, the controller 160 has to read the pages of temporary block and the current block to rebuild the physical-logical mapping table and the temporary-block table in the random access memory 166. However, the above method requires a long time to read all of the pages in the temporary block and the current block, and also requires an algorithm to determine the write order of the pages or to identify the new data and the old data.

In view of this, in one embodiment, the length of the system data sector is shorter than the length of each of the user-data areas DDA1~DDAN, such that controller 160 can write the current temporary-block table and the data into the page of the temporary block at the same time to back up the current temporary-block table. Therefore, when the data storage device 140 resumes operation after a power-off event, the controller 160 can directly read the page of the temporary block that was written last before the power-off event to obtain the last temporary-block table.

More specifically, when the data storage device 140 resumes operation after a power-off event, the controller 160 performs a search process to obtain a X-th page of the temporary block, wherein the X-th page is the page that was read last from the temporary block before the power-off event occurred, and X is a positive integer. Next, the controller 160 determines whether the X-th page can be successfully read, wherein when the data stored in the user-data area of the X-th page can be read with no error bits by error correction or another method, the controller 160 determines that the X-th page can be successfully read. When the X-th page can be successfully read, the controller 160 loads a first temporary-block table stored in the X-th page in the random access memory 166 to serve as the current temporary-block table.

In one embodiment, the controller 160 can correct the error bits of the data stored in the X-th page by a read retry process for successfully reading the X-th page. More specifically, the controller 160 respectively uses a plurality of read voltages to read the X-th page, and determines whether the X-th page can be successfully read based on different read voltages. In one embodiment, when the controller 160 successfully reads the X-th page by using two or more read voltages, the controller 160 further re-writes the X-th page to stabilize the data in the X-th page. Namely, when the controller 160 successfully reads the X-th page by using two or more read voltages, the controller 160 writes the data that was successfully read from the X-th page into the X-th page again.

In another embodiment, after the first temporary-block table is loaded in the random access memory, the controller 160 further updates the first temporary-block table according to the status of the current temporary block to produce a second temporary-block table, and writes the second temporary-block table and dummy data into the (X+1)-th page of the temporary block. It should be noted that, in some embodiments, the controller 160 only writes the latest temporary-block table (the second temporary-block table) into the user-data area of the (X+1)-th page, and the controller 160 will not write data other than the latest temporary-block table into the (X+1)-th page. Namely, the (X+1)-th page of the temporary block does not have other user data.

When the X-th page cannot be successfully read, the controller 160 reads the (X−1)-th page of the temporary block, and loads a third temporary-block table stored in the (X−1)-th page in the random access memory 166 to serve as the current temporary-block table. Moreover, when the X-th page cannot be successfully read, the controller 160 further selects a new block from the blocks to replace the original temporary block. More specifically, when the X-th page cannot be successfully read, the controller 160 abandons the current temporary block, selects another block to serve as a new temporary block, and writes the data stored in the 1-st~(X−1)th pages of the temporary block into the new temporary block.

In one embodiment of the search process, the controller 160 reads the spare areas of the pages distanced by a predetermined number of pages along the first direction D1 starting from the 1-st page of the temporary block until the read spare area does not have valid data. After reading the spare area without valid data, the controller 160 further reads the spare areas of the pages one by one along a second direction D2 starting from the page having the spare area without valid data of the temporary block until the read spare area has valid data, wherein the page having the spare area with valid data obtained by reading the pages along the second direction D2 is a first blank page, and the second direction D2 is opposite to the first direction D1. After obtaining the first blank page, the controller 160 further reads the user-data area of the first blank page, and determines whether the user-data area of the first blank page has valid data to confirm whether the first blank page is the first page without user data in the first direction D1 of the temporary block. When the user-data area of the first blank page has valid data, the controller 160 further reads the user-data areas of the pages one by one starting from the first blank page of the temporary block along the first direction D1 until the read user-data area does not have valid data, wherein the page having the user-data area without valid data is arranged to replace the first blank page to serve as a new first blank page. Lastly, the controller 160 further reads the user-data areas of the pages of the temporary block one by one starting from the page prior to the first blank page or starting from the page prior to the new first blank page along the second direction D2, and determines whether the read user-data area of the page has valid data to obtain the page that was the last page being written, wherein the page having the user-data area with valid data obtained by reading the pages along the second direction D2 is the X-th page, and the X-th page is the last page with valid data in the first direction.

Figure 3:
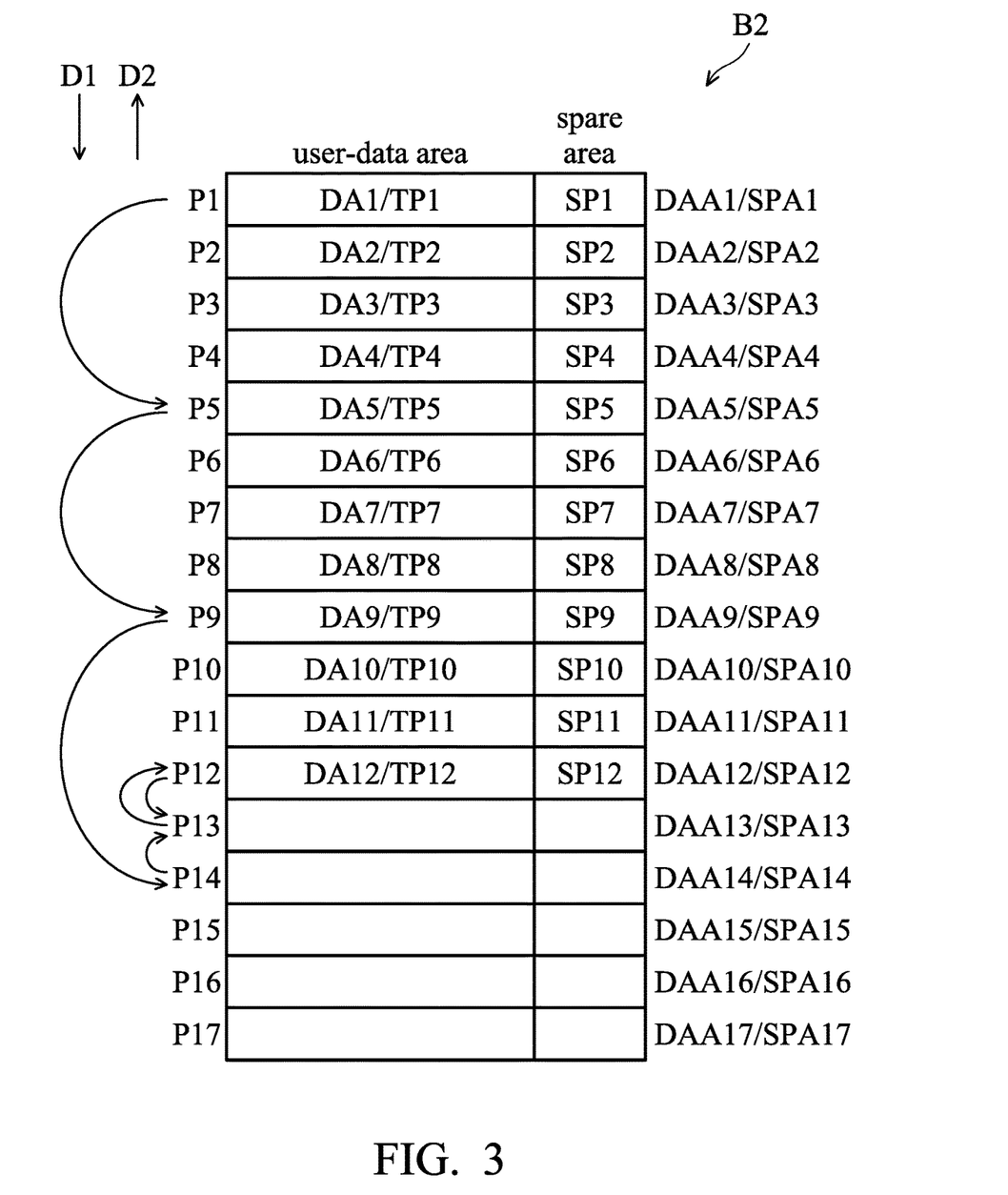
FIG. 3 is a schematic diagram illustrating a temporary block in accordance with an embodiment.

FIG. 3 is a schematic diagram illustrating a temporary block in accordance with an embodiment. In this embodiment, the temporary block B2 has seventeen pages P1~P17 arranged in sequence along the first direction D1, wherein FIG. 3 shows the status of the pages P1~P17 of the temporary block B2 after a power-off event has occurred. More specifically, the user-data areas DAA1~DAA12 of the 1-st~12-th pages P1~P12 of the temporary block B2 are written by the user data sectors DA~D12 and the temporary-block tables TP1~TP12, and the spare areas SP1~SP12 of the 1-st~12-th pages P1~P12 are written by valid data (spare data sectors SP1~SP12) as well.

In the search process, the controller 160 reads the spare areas of the pages distanced by a predetermined number of pages along the first direction D1 starting from the 1-st page P1 of the temporary block B2 until the read spare area does not have valid data. In this embodiment, the predetermined number is 3, but it is not limited thereto. Namely, the controller 160 reads the spare area SPA1 of the 1-st page P1 of the temporary block B2. The spare area SPA1 has valid data SP1, so the controller 160 continues to read the spare area SPA5 of the 5-th page which has a distance from the 1-st page P1 of three pages along the first direction D1. The spare area SPA5 has valid data SP5, so the controller 160 continues to read the spare area SPA9 of the 9-th page P9 which has a distance from the 5-th page P5 of three pages along the first direction D1. The spare area SPA9 of the page P9 has valid data SP9, such that the controller 160 continues to read the spare area SPA14 of the 14-th page which has a distance from the 9-st page P9 of three pages along the first direction D1. The spare area SPA14 of the page P14 does not have valid data, so the controller 160 stops reading the next spare area belonging to the page having a distance from the page P14 of the predetermined number of pages along the first direction D1. After obtaining the spare area SPA14 of the page P14 without valid data, the controller 160 further reads one by one the spare areas of the pages of the temporary block B2 along the second direction D2 starting from the 14-th page P14 until the read spare area has valid data. Namely, the controller 160 reads the spare area SPA13 of the 13-th page P13 which is prior to the 14-th page P14 along the second direction D2. The spare area SPA13 does not have valid data, so the controller 160 continues to read the spare area SPA12 of the 12-th page P12 which is prior to the 13-th page P13 along the second direction D2. The spare area SPA12 has valid data SP12, so the controller 160 stops reading the next spare area of the temporary block B2 along the second direction D2. It should be noted that, at this moment, the controller 160 will assume that the 12-th page P12 is the first page which is empty (first blank page) in the temporary block B2. Next, the controller 160 further reads the user-data area DDA12 of the 12-th page P12 (the first blank page), and determines whether the user-data area DDA12 of the 12-th page P12 has valid data to confirm that the 12-th page P12 of the temporary block B2 is the first page that does not have user data in the temporary block B2. In this embodiment, the user-data area DDA12 of the 12-th page P12 has valid data DA12 and TP12. Therefore, the controller 160 determines that the 12-th page P12 is not the first page without user data in the temporary block B2. Next, the controller 160 reads the user-data areas of the pages one by one starting from the 12-th page P12 of the temporary block B2 along the first direction D1 until the read user-data area does not have valid data. Namely, the controller 160 reads the user-data area DDA13 of the 13-th page P13 first. In this embodiment, the user-data area DDA13 does not have valid data, so the controller 160 replaces the original first blank page (the 12-th page P12) with the 13-th page P13, and uses the 13-th page P13 as a new first blank page. Namely, at this moment, the controller 160 confirms that the 13-th page P13 is the first page without valid data in the temporary block B2. Lastly, the controller 160 starts to determine which of pages was the last page being written in the temporary block B2. Namely, the controller 160 reads the user-data areas of the pages of the temporary block B2 one by one starting from the page (12-th page P12) prior to the 13-th page P13 (the first blank page) along the second direction D2. In this embodiment, the user-data area DAA12 of the 12-th page P12 has valid data DA12 and TP12. Therefore, the controller 160 obtains that the last page of the temporary block B2 that was written is the 12-th page P12, and the 12-th page P12 is the X-th page.

When the controller 160 determines that the 12-th page P12 can be successfully read, the controller 160 loads the temporary-block table TP12 stored in the 12-th page P12 in the random access memory 166 to serve as the current temporary-block table. When the controller 160 successfully reads the 12-th page P12 by using two or more read voltages, the controller 160 re-writes the data DA12 and TP12 into the 12-th page P12 to stabilize the data in the 12-th page P12. Moreover, after loading the temporary-block table TP12 in the random access memory 166 to serve as the current temporary-block table, the controller 160 further writes dummy data and the current temporary-block table updated according to the current status of the temporary block into the 13-th page P13 of the temporary block B2.

When the controller 160 determines that the 12-th page P12 cannot be successfully read, the controller 160 reads the 11-th page P11 of the temporary block B2, and loads the temporary-block table TP11 stored in the 11-th page P11 in the random access memory 166 to serve as the current temporary-block table. Moreover, the controller 160 further selects a new block (such as, the block B5) to replace the original temporary block B2. More specifically, when the 12-th page P12 cannot be successfully read, the controller 160 further abandons the temporary block B2, selects the block B5 to serve as a new temporary block, and writes the data sectors DA1~DA11 and the data sectors TP1~TP11 stored in the 1-st page~the 11-th page P11 of the temporary block B2 into the temporary block B5.

Figure 4:
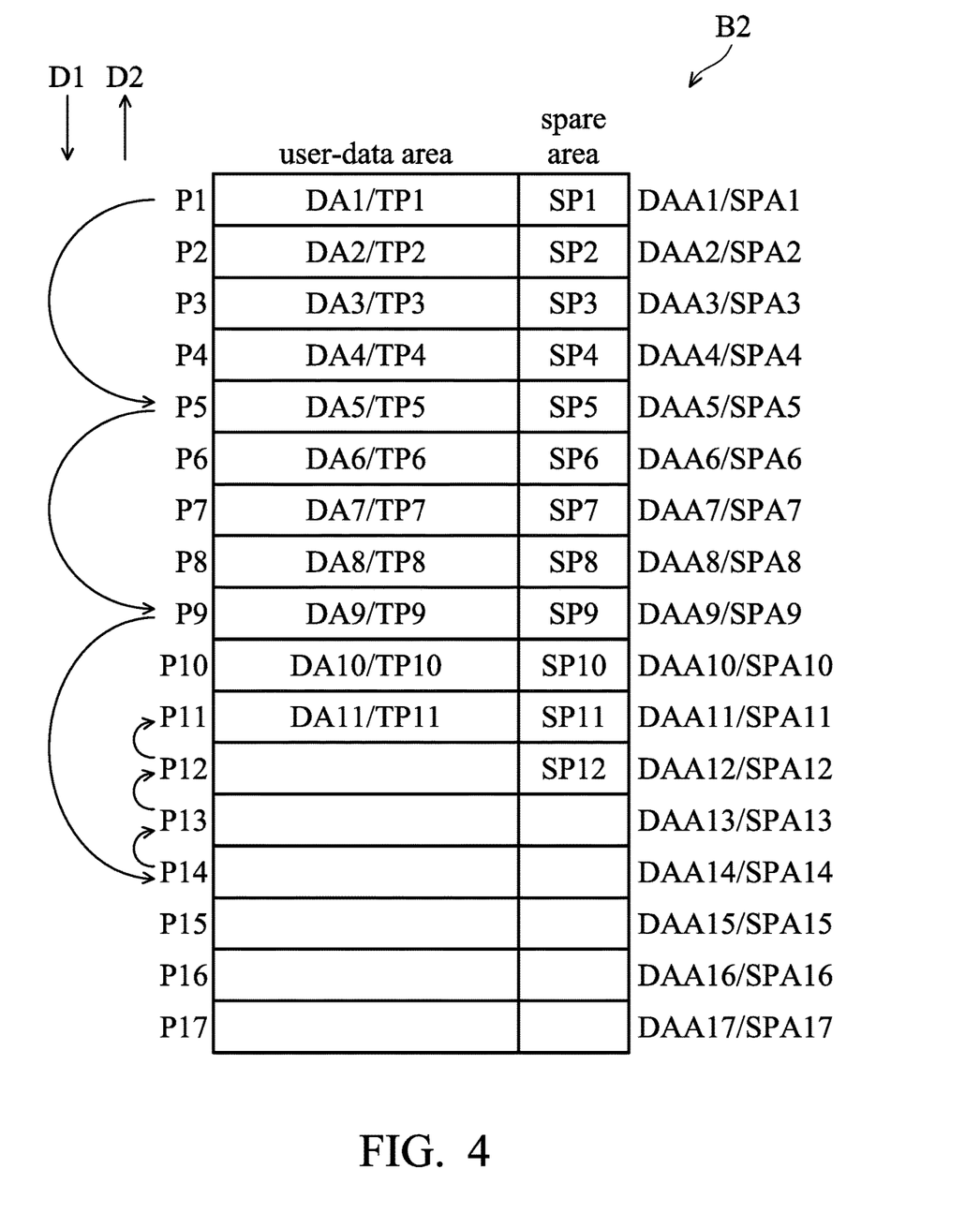
FIG. 4 is a schematic diagram illustrating a temporary block in accordance with another embodiment.

FIG. 4 is a schematic diagram illustrating a temporary block in accordance with another embodiment. In this embodiment, the temporary block B2 has seventeen pages P1~P17 arranged in sequence along the first direction D1, wherein FIG. 4 shows the status of the pages P1~P17 of the temporary block B2 after a power-off event has occurred. More specifically, the user-data areas DAA1~DAA11 of the 1-st~11-th pages P1~P11 of the temporary block B2 are written with valid data (the user data sectors DA~D11 and the temporary-block tables TP1~TP11), and the spare areas SP1~SP12 of the 1-st~12-th pages P1~P12 are written with valid data (the spare data sectors SP1~SP12).

In the search process, the controller 160 reads the spare areas of the pages distanced by a predetermined number of pages along the first direction D1 starting from the 1-st page P1 of the temporary block B2 until the read spare area does not have valid data. In this embodiment, the predetermined number is 3, but it is not limited thereto. Namely, the controller 160 reads the spare area SPA1 of the 1-st page P1 of the temporary block B2, first. The spare area SPA1 has valid data SP1, so the controller 160 continues to read the spare area SPA5 of the 5-th page P5 which has a distance from the 1-st page P1 of three pages along the first direction D1. The spare area SPA5 has valid data SPS, so the controller 160 continues to read the spare area SPA9 of the 9-th page P9 which has a distance from the 5-th page P5 of three pages along the first direction D1. The spare area SPA9 of the page P9 has valid data SP9, such that the controller 160 continues to read the spare area SPA14 of the 14-th page which has a distance from the 9-st page P9 of three pages along the first direction D1. The spare area SPA14 of the page P14 does not have valid data, so the controller 160 stops reading the next spare area belonging to the page having a distance from the page P14 of the predetermined number of pages along the first direction D1. After obtaining the spare area SPA14 of the page P14 without valid data, the controller 160 further reads one by one the spare areas of the pages of the temporary block B2 along the second direction D2 starting from the 14-th page P14 until the read spare area has valid data. Namely, the controller 160 reads the spare area SPA13 of the 13-th page P13 which is prior to the 14-th page P14 along the second direction D2. The spare area SPA13 does not have valid data, so the controller 160 continues to read the spare area SPA12 of the 12-th page P12 which is prior to the 13-th page P13 along the second direction D2. The spare area SPA12 has valid data SP12, so the controller 160 stops reading the next spare area of the temporary block B2 along the second direction D2. It should be noted that, at this moment, the controller 160 will assume that the 12-th page P12 is the first page which is empty (first blank page) in the temporary block B2. Next, the controller 160 further reads the user-data area DDA12 of the 12-th page P12 (the first blank page), and determines whether the user-data area DDA12 of the 12-th page P12 has valid data to confirm that the 12-th page P12 of the temporary block B2 is the first page that does not have user data in the temporary block B2. In this embodiment, the user-data area DDA12 of the 12-th page P12 does not have valid data. Therefore, the controller 160 determines that the 12-th page P12 is the first page without user data in the temporary block B2. Lastly, the controller 160 starts to determine which of the pages was the last page being written in the temporary block B2. Namely, the controller 160 reads the user-data areas of the pages of the temporary block B2 one by one starting from the page (11-th page P11) prior to the 12-th page P12 (the first blank page) along the second direction D2. In this embodiment, the user-data area DAA11 of the 11-th page P11 has valid data DA11 and TP11. Therefore, the controller 160 obtains that the last page of the temporary block B2 that was written is the 11-th page P11, and the 11-th page P11 is the X-th page.

When the controller 160 determines that the 11-th page P11 can be successfully read, the controller 160 loads the temporary-block table TP11 stored in the 11-th page P11 in the random access memory 166 to serve as the current temporary-block table. When the controller 160 successfully reads the 11-th page P11 by using two or more read voltages, the controller 160 re-writes the data DA11 and TP11 into the 11-th page P11 to stabilize the data in the 11-th page P11. Moreover, after loading the temporary-block table TP11 in the random access memory 166 to serve as the current temporary-block table, the controller 160 further writes dummy data and the current temporary-block table updated according to the current status of the temporary block into the 12-th page P12 of the temporary block B2, and updates the spare data SP12 of the 12-th page P12.

When the controller 160 determines that the 11-th page P11 cannot be successfully read, the controller 160 reads the 10-th page P10 of the temporary block B2, and loads the temporary-block table TP10 stored in the 10-th page P10 in the random access memory 166 to serve as the current temporary-block table. Moreover, the controller 160 further selects a new block (such as, the block B5) to replace the original temporary block B2. More specifically, when the 11-th page P11 cannot be successfully read, the controller 160 further abandons the temporary block B2, selects the block B5 to serve as a new temporary block, and writes the data sectors DA1~DA10 and the data sectors TP1~TP10 stored in the 1-st page P1~the 10-th page P10 of the temporary block B2 into the temporary block B5.

Figure 5:
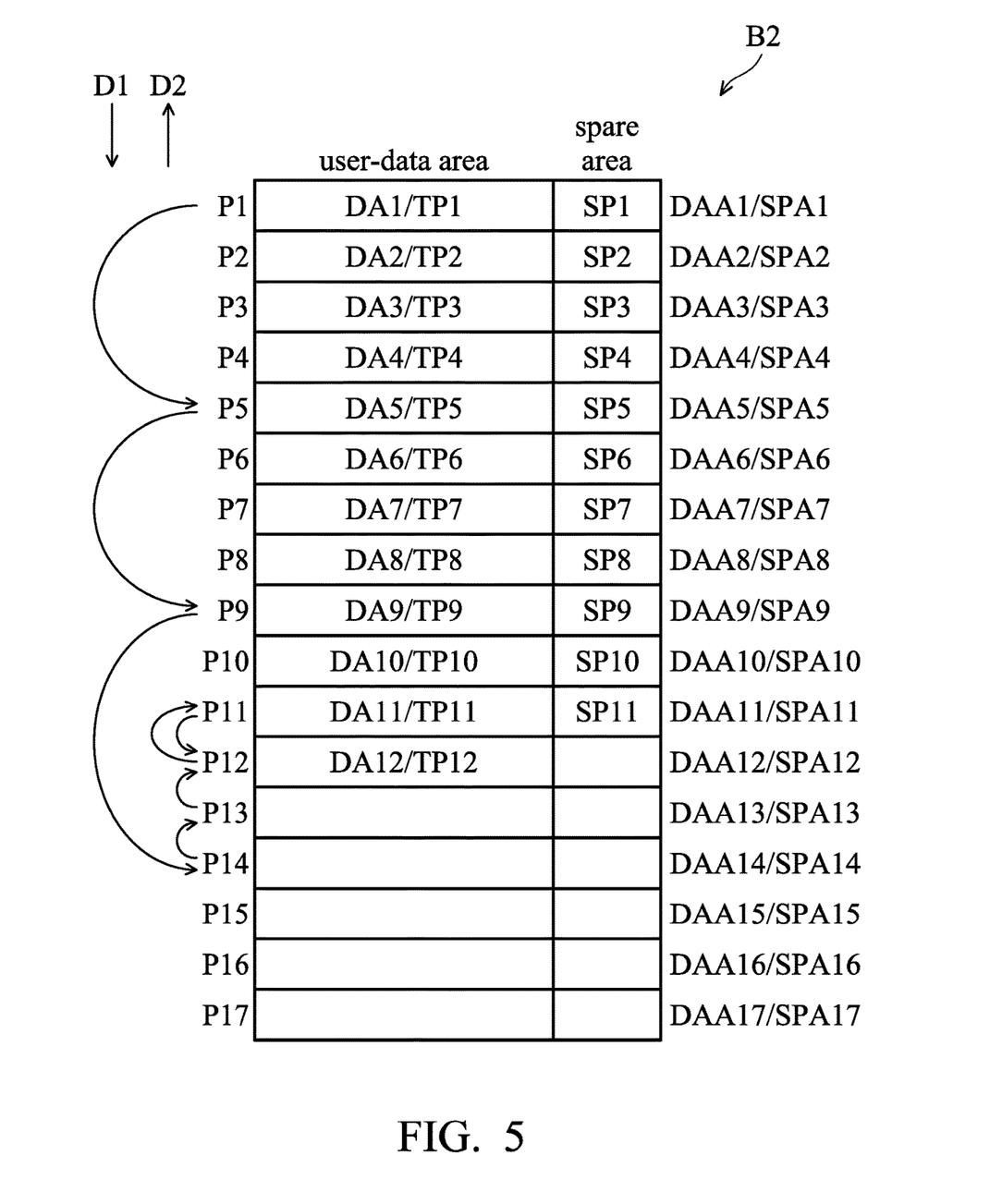
FIG. 5 is a schematic diagram illustrating a temporary block in accordance with another embodiment.

FIG. 5 is a schematic diagram illustrating a temporary block in accordance with another embodiment. In this embodiment, the temporary block B2 has seventeen pages P1~P17 arranged in sequence along the first direction D1, wherein FIG. 3 shows the status of the pages P1~P17 of the temporary block B2 after a power-off event has occurred. More specifically, the user-data areas DAA1~DAA12 of the 1-st~12-th pages P1~P12 of the temporary block B2 have the user data sectors DA~D12 and the temporary-block tables TP1~TP12, and the spare areas SP1~SP11 of the 1-st~11-th pages P1~P11 have valid data (spare data sectors SP1~SP11) as well.

In the search process, the controller 160 reads the spare areas of the pages distanced by a predetermined number of pages along the first direction D1 starting from the 1-st page P1 of the temporary block B2 until the read spare area does not have valid data. In this embodiment, the predetermined number is 3, but it is not limited thereto. Namely, the controller 160 reads the spare area SPA1 of the 1-st page P1 of the temporary block B2. The spare area SPA1 has valid data SP1, so the controller 160 continues to read the spare area SPA5 of the 5-th page which has a distance from the 1-st page P1 of three pages along the first direction D1. The spare area SPA5 has valid data SPS, so the controller 160 continues to read the spare area SPA9 of the 9-th page P9 which has a distance from the 5-th page P5 of three pages along the first direction D1. The spare area SPA9 of the page P9 has valid data SP9, such that the controller 160 continues to read the spare area SPA14 of the 14-th page which has a distance from the 9-st page P9 of three pages along the first direction D1. The spare area SPA14 of the page P14 does not have valid data, so the controller 160 stops reading the next spare area belonging to the page having a distance from the page P14 of the predetermined number of pages along the first direction D1. After obtaining the spare area SPA14 of the page P14 without valid data, the controller 160 further reads one by one the spare areas of the pages of the temporary block B2 along the second direction D2 starting from the 14-th page P14 until the read spare area has valid data. Namely, the controller 160 reads the spare area SPA13 of the 13-th page P13 which is prior to the 14-th page P14 along the second direction D2. The spare area SPA13 does not have valid data, so the controller 160 continues to read the spare area SPA12 of the 12-th page P12 which is prior to the 13-th page P13 along the second direction D2. The spare area SPA12 also does not have valid data, so the controller 160 continues to read the spare area SP11 of the 11-th page P11 which is prior to the 12-th page P12 along the second direction D2. The spare area SPA11 has valid data, so the controller 160 stops reading the next spare area of the temporary block B2 along the second direction D2. It should be noted that, at this moment, the controller 160 will assume that the 11-th page P11 is the first page which is empty (first blank page) in the temporary block B2. Next, the controller 160 further reads the user-data area DDA11 of the 11-th page P11 (the first blank page), and determines whether the user-data area DDA11 of the 11-th page P11 has valid data to confirm that the 11-th page P11 of the temporary block B2 is the first page that does not have user data in the temporary block B2. In this embodiment, the user-data area DDA11 of the 11-th page P11 has valid data DA11 and TP11. Therefore, the controller 160 determines that the 11-th page P11 is not the first page without user data in the temporary block B2. Next, the controller 160 reads the user-data areas of the pages one by one starting from the 11-th page P11 of the temporary block B2 along the first direction D1 until the read user-data area does not have valid data. Namely, the controller 160 reads the user-data area DDA12 of the 12-th page P12 first. In this embodiment, the user-data area DDA12 has valid data DA12 and TP12, so the controller 160 continues to read the user-data area DDA13 of the 13-th page P13. The user-data area DDA13 does not have valid data, so the controller 160 replaces the original first blank page (the 11-th page P11) with the 13-th page P13, and uses the 13-th page P13 as a new first blank page. Namely, at this moment, the controller 160 confirms that the 13-th page P13 is the first page without valid data in the temporary block B2. Lastly, the controller 160 starts to determine which of the pages was the last page being written in the temporary block B2. Namely, the controller 160 reads the user-data areas of the pages of the temporary block B2 one by one starting from the page (12-th page P12) prior to the 13-th page P13 (the first blank page) along the second direction D2. In this embodiment, the user-data area DAA12 of the 12-th page P12 has valid data DA12 and TP12. Therefore, the controller 160 obtains that the last page of the temporary block B2 that was written is the 12-th page P12, and the 12-th page P12 is the X-th page.

Figure 6:
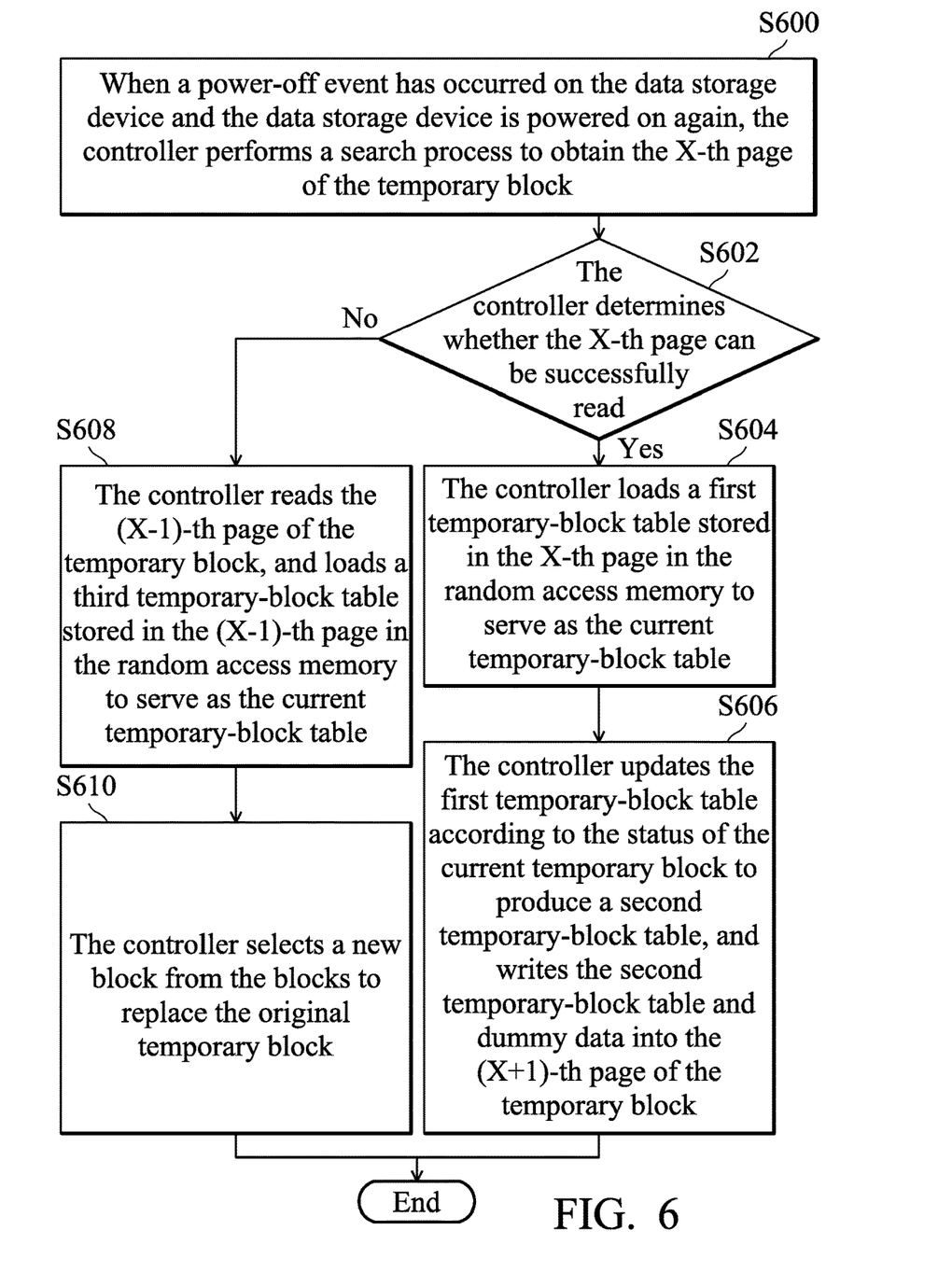
FIG. 6 is a flowchart of a data maintenance method in accordance with an embodiment.

FIG. 6 is a flowchart of a data maintenance method in accordance with an embodiment. The data maintenance method is applied on the data storage device 140 of FIG. 1 for rebuilding the data status after the data storage device 140 resumes operation after a power-off event. The process starts at step S600.

In step S600, when a power-off event has occurred on the data storage device 140 and the data storage device 140 is powered on again, the controller 160 performs a search process to obtain the X-th page of the temporary block, wherein the X-th page is the page that was read last from the temporary block before the power-off event occurred, and X is a positive integer.

Next, in step S602, the controller 160 determines whether the X-th page can be successfully read, wherein when the data stored in the user-data area of the X-th page can be read with no error bits by error correction or another method, the controller 160 determines that the X-th page can be successfully read. When the X-th page can be successfully read, the process goes to step S604; otherwise the process goes to step S608.

In step S604, the controller 160 loads a first temporary-block table stored in the X-th page in the random access memory 166 to serve as the current temporary-block table.

Next, in step S606, the controller 160 updates the first temporary-block table according to the status of the current temporary block to produce a second temporary-block table, and writes the second temporary-block table and dummy data into the (X+1)-th page of the temporary block. It should be noted that, in some embodiments, the controller 160 only writes the latest temporary-block table (the second temporary-block table) into the user-data area of the (X+1)-th page, and the controller 160 will not write data other than the latest temporary-block table into the (X+1)-th page. Namely, the (X+1)-th page of the temporary block does not have other user data. The process ends at step S606, the controller 160 continues to use the original temporary block stored in the system data sector.

In step S608, the controller 160 reads the (X−1)-th page of the temporary block, and loads a third temporary-block table stored in the (X−1)-th page in the random access memory 166 to serve as the current temporary-block table.

Next, in step S610, the controller 160 selects a new block from the blocks to replace the original temporary block. More specifically, when the X-th page cannot be successfully read, the controller 160 abandons the current temporary block, selects another block to serve as a new temporary block, and writes the data stored in the 1-st~(X−1)th pages of the temporary block into the new temporary block. The process ends at step S610.

Figure 7A:
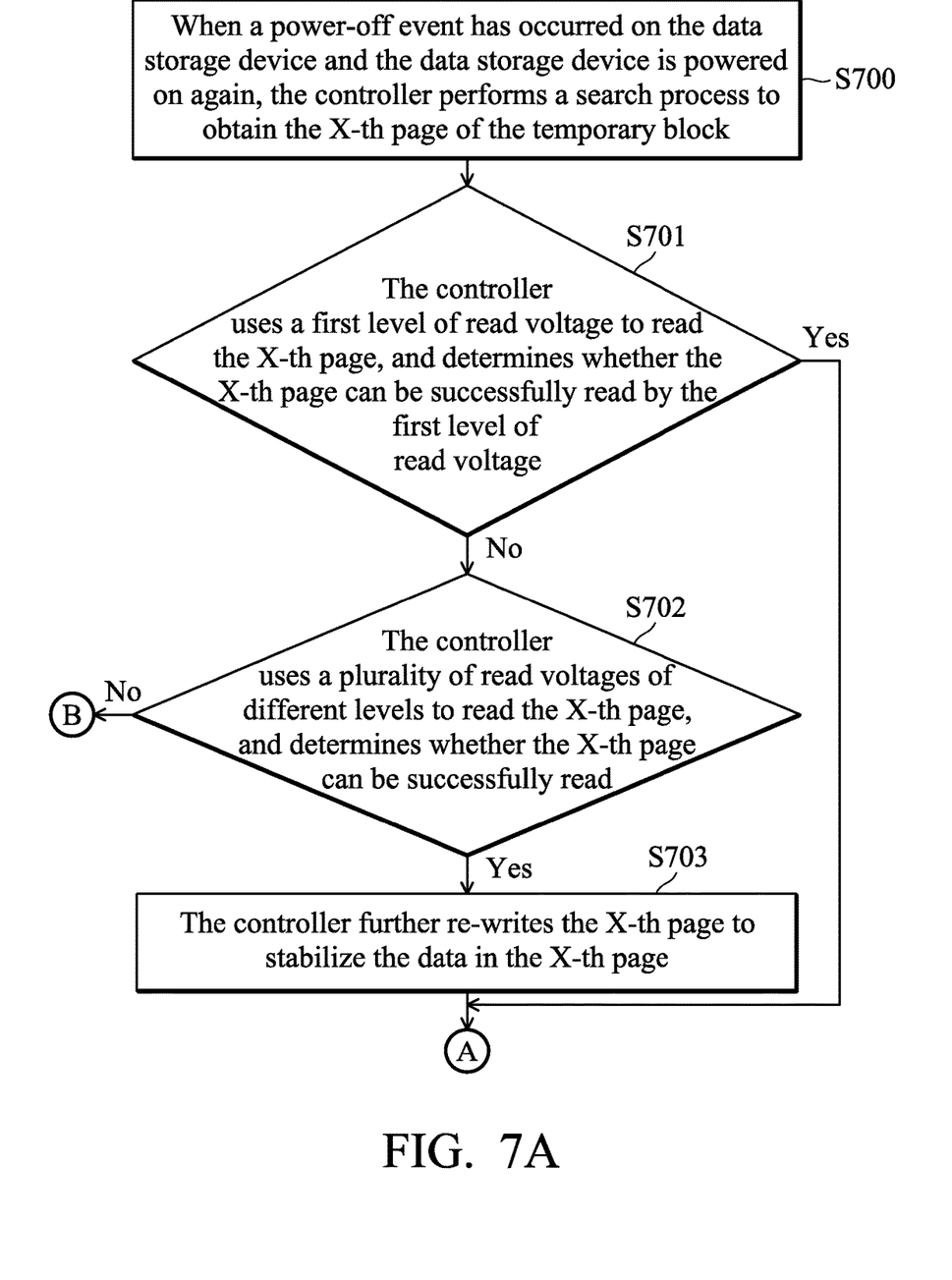
FIG. 7A-7B are a flowchart of a method for organizing a current block table in accordance with an embodiment.
Figure 7B:
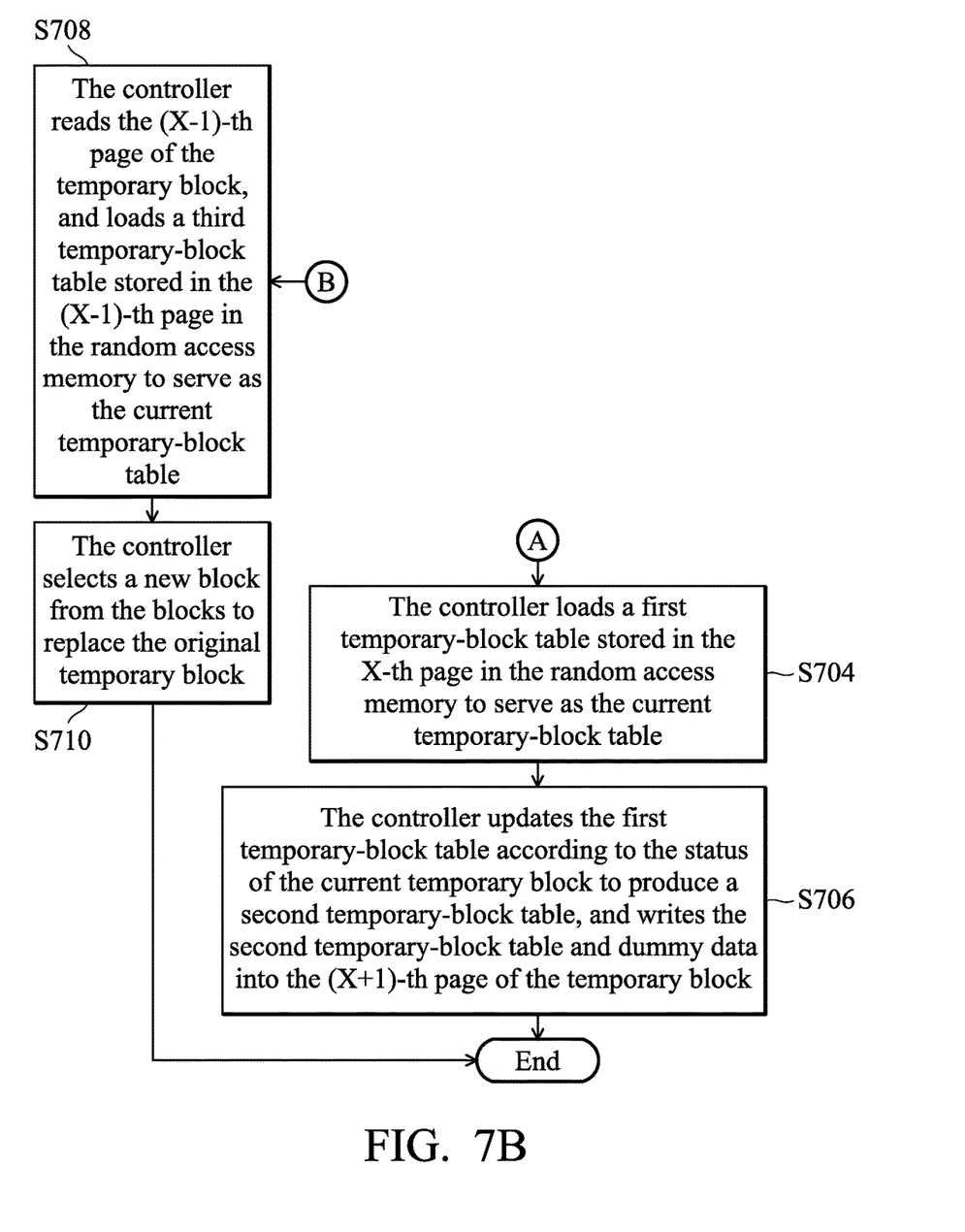

FIG. 7A-7B are a flowchart of a method for organizing a current block table in accordance with an embodiment. The data maintenance method is applied to the data storage device 140 of FIG. 1 for rebuilding the data status after the data storage device 140 resumes operation after a power-off event. The process starts at step S700, wherein steps S704~S710 are similar to steps S604~S610 of FIG.6. The details of steps S704~S710 can be referred to in FIG. 6.

In step S700, when a power-off event has occurred on the data storage device 140 and the data storage device 140 is powered on again, the controller 160 performs a search process to obtain the X-th page of the temporary block, wherein the X-th page is the page that was read last from the temporary block before the power-off event occurred, and X is a positive integer.

Next, in step S701, the controller 160 uses a first level of read voltage to read the X-th page, and determines whether the X-th page can be successfully read by the first level of read voltage. When the X-th page can be successfully read, the process goes to step S704; otherwise the process goes to step S703.

In step S702, the controller 160 uses a plurality of read voltages of different levels to read the X-th page, and determines whether the X-th page can be successfully read. When the X-th page can be successfully read, the process goes to step S703, otherwise, the process goes to step S708.

In step S703, the controller 160 further re-writes the X-th page to stabilize the data in the X-th page. Namely, when the controller 160 successfully reads the X-th page by using two or more read voltages, the controller 160 writes the data that was successfully read from the X-th page into the X-th page again.

Figure 8:
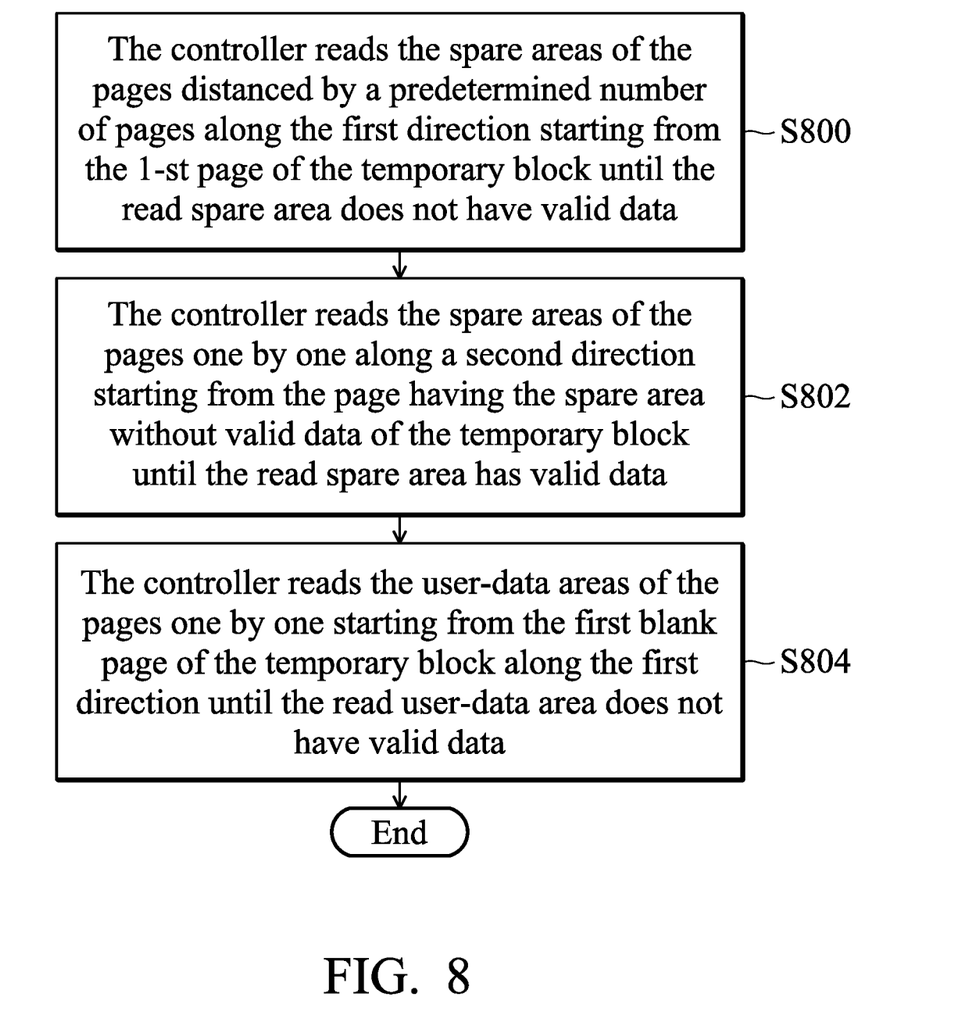
FIG. 8 is a flowchart of a search process in accordance with an embodiment.

FIG. 8 is a flowchart of a search process in accordance with an embodiment. The search process is applied to the data storage device 140 of FIG. 1 for finding the page that was written last when the data storage device 140 resumes operation after a power-off event in step S600 of FIG. 4 and step S700 of FIGS. 7A-7B. The process starts at step S800.

In step S800, the controller 160 reads the spare areas of the pages distanced by a predetermined number of pages along the first direction D1 starting from the 1-st page of the temporary block until the read spare area does not have valid data.

Next, in step S802, the controller 160 reads the spare areas of the pages one by one along a second direction D2 starting from the page having the spare area without valid data of the temporary block until the read spare area has valid data, wherein the page having the spare area with valid data obtained by reading the pages along the second direction D2 is assumed as the first page with valid data (a first blank page), and the second direction D2 is opposite to the first direction D1.

Next, in step S804, the controller 160 reads the user-data areas of the pages one by one starting from the first blank page of the temporary block along the first direction D1 until the read user-data area does not have valid data.

Lastly, the controller 160 further reads the user-data areas of the pages of the temporary block one by one starting from the page prior to the first blank page or starting from the page prior to the new first blank page along the second direction D2, and determines whether the read user-data area of the page has valid data to obtain the page that was the last page being written, wherein the page having the user-data area with valid data obtained by reading the pages along the second direction D2 is the X-th page, and the X-th page is the last page with valid data in the first direction.

The data storage device 140 and the data maintenance method provided by the present invention may store the system data in the temporary block, and back up the temporary-block table in every page of the temporary block.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
    a flash memory, having a plurality of blocks, wherein each of the blocks has a plurality of pages arranged sequentially along a first direction; and
    a controller, determining whether an X-th page of a temporary block of the blocks can be successfully read when the data storage device resumes operation after a power-off event, and writing dummy data and a temporary-block table into the (X+1)-th page of the temporary block when the X-th page can be successfully read, wherein the X-th page is the page that was read last from the temporary block before the power-off event occurred, the temporary-block table records the information of all the pages in the temporary block, and X is a positive integer.

2. The data storage device as claimed in claim 1, wherein each of the pages in the temporary block is arranged to store a system data sector which is shorter than a predetermined length.

3. The data storage device as claimed in claim 1, wherein the (X+1)-th page of the temporary block does not have user data.

4. The data storage device as claimed in claim 1, wherein the controller repeatedly reads the X-th page by using a plurality of read voltages to determine whether the X-th page can be successfully read, wherein when the controller successfully reads the X-th page by using two or more of the read voltages, the controller writes the data which was successfully read from the X-th page into the X-th page.

5. The data storage device as claimed in claim 1, wherein when the X-th page cannot be successfully read, the controller reads the (X−1)-th page of the temporary block.

6. The data storage device as claimed in claim 5, wherein when the X-th page cannot be successfully read, the controller abandons the temporary block and selects one of the blocks to serve as a new temporary block, and writes the data stored in the 1-st~(X−1)th pages of the temporary block into the new temporary block.

7. The data storage device as claimed in claim 1, wherein each of the pages has a user-data area and a spare area, and the controller obtains the X-th page of the temporary block through a search process, wherein in the search process, the controller reads the spare areas of the pages distanced by a predetermined number of pages along the first direction starting from the 1-st page of the temporary block until the read spare area does not have valid data.

8. The data storage device as claimed in claim 7, wherein after reading the spare area without valid data, the controller further reads the spare areas of the pages one by one along a second direction starting from the page having the spare area without valid data of the temporary block until the read spare area has valid data, wherein the page having the spare area with valid data obtained by reading the pages along the second direction is a first blank page, and the second direction is opposite to the first direction.

9. The data storage device as claimed in claim 8, wherein the controller further reads the user-data area of the first blank page, and determines whether the user-data area of the first blank page has valid data to confirm whether the first blank page is the first page without user data in the first direction of the temporary block, wherein when the user-data area of the first blank page has valid data, the controller further reads the user-data areas of the pages one by one starting from the first blank page of the temporary block along the first direction until the read user-data area does not have valid data, wherein the page having the user-data area without valid data is arranged to replace the first blank page to serve as a new first blank page.

10. The data storage device as claimed in claim 9, wherein the controller further reads the user-data areas of the pages of the temporary block one by one starting from the page prior to the first blank page or starting from the page prior to the new first blank page along the second direction, and determines whether the read user-data area of the page has valid data, wherein the page having the user-data area with valid data obtained by reading the pages along the second direction is the X-th page, and the X-th page is the last page with valid data in the first direction.

11. The data storage device as claimed in claim 1, wherein each of the pages has a user-data area and a spare area, wherein the spare areas are arranged to store the information of the corresponding pages, the user-data area of each of the pages of the temporary block is arranged to store a system data sector that is shorter than a predetermined length, and the temporary-block table is stored in the spare area of the (X+1)-th page.

12. A data maintenance method, applied to a data storage device having a flash memory, wherein the flash memory comprises a plurality of blocks, and each of the blocks has a plurality of pages arranged sequentially along a first direction, the data maintenance method comprising:
    determining whether an X-th page of a temporary block of the blocks can be successfully read when the data storage device resumes operation after a power-off event; and
    writing dummy data and a temporary-block table into the (X+1)-th page of the temporary block when the X-th page can be successfully read, wherein the X-th page is the page that was read last from the temporary block before the power-off event occurred, the temporary-block table records the information of all the pages in the temporary block, and X is a positive integer.

13. The data maintenance method as claimed in claim 12, wherein each of the pages in the temporary block is arranged to store a system data sector which is shorter than a predetermined length.

14. The data maintenance method as claimed in claim 12, wherein the (X+1)-th page of the temporary block does not have user data.

15. The data maintenance method as claimed in claim 12, wherein the step of determining whether the X-th page can be successfully read further comprises:
    repeatedly reading the X-th page by using a plurality of read voltages to determine whether the X-th page can be successfully read, wherein when the controller suc-cessfully reads the X-th page by using two or more of the read voltages, the data maintenance method further comprises writing the data which was successfully read from the X-th page into the X-th page.

16. The data maintenance method as claimed in claim 12, further comprising:
    when the X-th page cannot be successfully read, reading the (X−1)-th page of the temporary block.

17. The data maintenance method as claimed in claim 16, further comprising:
    when the X-th page cannot be successfully read, abandoning the temporary block and selecting one of the blocks to serve as a new temporary block, and writing the data stored in the 1-st~(X−1)-th pages of the temporary block into the new temporary block.

18. The data maintenance method as claimed in claim 12, wherein each of the pages has a user-data area and a spare area, and the data maintenance method further comprises obtaining the X-th page of the temporary block through a search process, wherein the search process comprises:
    reading the spare areas of the pages distanced by a predetermined number of pages along the first direction starting from the 1-st page of the temporary block until the read spare area does not have valid data.

19. The data maintenance method as claimed in claim 18, further comprising:
    after reading the spare area without valid data, reading the spare areas of the pages one by one along a second direction starting from the page having the spare area without valid data of the temporary block until the read spare area has valid data, wherein the page having the spare area with valid data obtained by reading the pages along the second direction is a first blank page, and the second direction is opposite to the first direction.

20. The data maintenance method as claimed in claim 19, further comprising:
    reading the user-data area of the first blank page, and determining whether the user-data area of the first blank page has valid data to confirm whether the first blank page is the first page without user data in the first direction of the temporary block; and
    when the user-data area of the first blank page has valid data, reading the user-data areas of the pages one by one starting from the first blank page of the temporary block along the first direction until the read user-data area does not have valid data, wherein the page having the user-data area without valid data is arranged to replace the first blank page to serve as a new first blank page.

21. The data maintenance method as claimed in claim 20, further comprising:
    reading the user-data areas of the pages of the temporary block one by one starting from the page prior to the first blank page or starting from the page prior to the new first blank page along the second direction; and
    determining whether the read user-data area of the page has valid data, reading the pages along the second direction is the X-th page, and the X-th page is the last page with valid data in the first direction.

22. The data maintenance method as claimed in claim 20, wherein each of the pages has a user-data area and a spare area, wherein the spare areas are arranged to store the information of the corresponding pages, the user-data area of each of the pages of the temporary block is arranged to store a system data sector that is shorter than a predetermined length, and the temporary-block table is stored in the spare area of the (X+1)-th page.

* * * * *